(12) United States Patent
Hortig et al.

(10) Patent No.: US 8,116,098 B2
(45) Date of Patent: Feb. 14, 2012

(54) BASE ELEMENT, BASE SYSTEM AND METHOD FOR MANUFACTURING ANOTHER BASE SYSTEM

(75) Inventors: Michael Hortig, Eningen (DE); Peter Kunert, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 555 days.

(21) Appl. No.: 12/269,481

(22) Filed: Nov. 12, 2008

(65) Prior Publication Data
US 2009/0122503 A1 May 14, 2009

(30) Foreign Application Priority Data
Nov. 12, 2007 (DE) .......................... 10 2007 053 808

(51) Int. Cl.
*H05K 1/11* (2006.01)

(52) U.S. Cl. ...................................... 361/803; 174/260

(58) Field of Classification Search .................. 361/803; 174/260–262; 73/493, 431; 29/830
See application file for complete search history.

(56) References Cited

U.S. PATENT DOCUMENTS

| 6,332,359 B1 * | 12/2001 | Ueyanagi et al. .......... 73/514.33 |
| 6,798,609 B1 * | 9/2004 | Bonin et al. ............... 360/78.05 |
| 7,557,470 B2 * | 7/2009 | Culpepper et al. .............. 310/15 |

FOREIGN PATENT DOCUMENTS

| EP | 0 665 438 | 8/1995 |
| JP | 2-147864 | 6/1990 |
| JP | 11-211750 | 8/1999 |
| JP | 2001-60750 | 3/2001 |

* cited by examiner

Primary Examiner — Yuriy Semenenko
(74) Attorney, Agent, or Firm — Kenyon & Kenyon LLP

(57) ABSTRACT

A base element having a first and a second surface, the first surface being designed to receive a module housing and the second surface being designed to be mounted on a carrier element, and in addition an angle between 0 and 90 degrees being provided between a first face normal of the first surface and a second face normal of the second surface.

8 Claims, 1 Drawing Sheet

BASE ELEMENT, BASE SYSTEM AND METHOD FOR MANUFACTURING ANOTHER BASE SYSTEM

BACKGROUND INFORMATION

Base elements are generally known. For example, from European Patent No. EP 0 665 438 a chip carrier mounted on a circuit board is known on which an acceleration sensor is mounted in such a way that a measuring axis of the acceleration sensor is oriented parallel to the circuit board. There is no provision for mounting the acceleration sensor on the chip carrier at an application-specific angle other than 90 degrees between the measuring axis and the circuit board.

SUMMARY OF THE INVENTION

The base element according to the present invention, the base system according to the present invention, and the method according to the present invention for manufacturing another base system have the advantage over the related art that a module housing is mountable or mechanically fixable on a carrier element at any desired application-specific angle between 0 and 90 degrees in a comparatively simple manner. In many applications, a defined orientation of the module housing relative to the carrier element is crucial to the functionality of the application, as for example when acceleration sensors and rotational speed sensors are used in the module housing, which normally have a main sensing direction. When the module housing is mounted on a carrier element, such as a carrier plate, for example, according to the related art the carrier direction is determined by the position of the carrier element. In contrast, the base element according to the present invention makes it possible to mount the module housing at any desired angle relative to the carrier element, so that in particular the sensing direction may be chosen independently of the orientation of the carrier element and thus specifically for the application. Furthermore, mounting the carrier element is greatly simplified compared to the related art, in particular when the carrier element is integrated into comparatively compact and/or specially shaped spaces for installation, such as when using sensors in a vehicle, for example, since the mounting position of the carrier element with respect to the desired module housing position is compensated for by the base element. In particular, the base element makes it possible especially advantageously to mount a standard housing on a standard carrier element at any desired angle between 0 and 90 degrees.

A preferred refinement provides that the module housing and the carrier element have a first and a second main extension plane having a third and a fourth face normal, it being provided that the third face normal runs essentially parallel to the first face normal and the fourth face normal runs essentially parallel to the second face normal. Especially advantageously, an application-specifically defined angle between the first and second main extension planes is thus implementable, which lies between 0 and 90 degrees, and the orientation of the first main extension plane or of the module housing vis-à-vis the second main extension plane or the carrier element is freely choosable.

Another preferred refinement provides that the carrier element includes a circuit board, a board, a conductor path and/or a plurality of conductor paths, so that especially advantageously the module housing is integratable into an electrical circuit of a board through the base element in a conventional manner.

Another preferred refinement provides that the module housing includes an electrical, electronic and/or microelectronic component, preferably a micromechanical sensor and especially preferably a micromechanical rotational speed sensor and/or acceleration sensor. Especially advantageously, it is thus possible in particular to set the main sensing direction of sensors independently of the orientation of the carrier element, such as a board, for example. Furthermore, this makes possible a comparatively constructionally compact and simple or economical realization of sensors and/or sensor circuits in spaces for installation that are of any shape and comparatively small, which are found in particular in the automotive industry.

Another preferred refinement provides that the base element has a spring element designed in such a way that a spring motion of the first surface parallel to the first face normal and/or second face normal is made possible, and/or that the base element has a pre-fixing edge. Especially advantageously, before the final mechanical fixing of a module housing on the first surface, "sliding off" of the module housing from the first surface, which represents in particular an inclined plane, is prevented by the pre-fixing edge. This is especially advantageous in particular when a soldering paste is used for mechanical or electrical contacting of the module housing, since that does not make a mechanically stable contact until it has hardened. Furthermore, the spring motion makes it possible to use a screen printing process to apply the soldering paste to the first surface, since the prefixing edge is swiveled in the direction of the second surface by the spring motion during the printing of the soldering paste and thus does not influence the screen printing process negatively.

Another preferred refinement provides that the base element has a third surface with a fifth face normal, the fifth face normal running essentially parallel to the second face normal. Especially advantageously, this makes it possible to place components on the carrier element automatically, since the base element is grippable or fixable on the third surface for an automatic printed board assembly. In particular, the third surface forms a suction surface for a vacuum-based gripping arm of an automatic printed board assembly.

Another preferred refinement provides that the first surface has a first electrical connection surface for the module housing and/or the second surface has a second electrical connection surface for the carrier element, where preferably the first and/or the second connection surface includes a standardized connection surface, and especially preferably the first connection surface is not identical to the second connection surface. Especially advantageously, the contacting surfaces include "footprints" of the standard bases or standard connectors, so that the standard module housing is placeable on the base element and/or the base element is placeable on standard connection surfaces of the carrier element. Thus, for example, the base element can be integrated in a simple manner between a module housing that is plugged onto a circuit board and the circuit board, in order to set the module housing at a desired angle relative to the circuit board. Especially advantageously, the first and second connection surfaces have different "footprints," so that the base element also functions as an adapter between the first contact surface and the second contact surface.

Another preferred refinement provides that the base element has at least one electrically conductive connection between the module housing and the carrier element, and preferably between the first and the second connection surfaces. Advantageously, it is thus possible to make electrical contact with the module housing or the components of the module housing through the base element. Especially advantageously, the module housing or the components of the module housing are thus integrated into a circuit of the carrier element in a conventional manner.

Another subject matter of the present invention is a base system having a base element and a module housing, the module housing being materially, frictionally and/or positively fixed mechanically on the first surface. Especially advantageously, the application-specifically required orientation of the module housing relative to the second surface is thus determined, so that the base element together with the module housing is mountable in a conventional manner on a carrier element, and at the same time the required application-specific angle between the module housing and the carrier element is implemented.

Another subject matter of the present invention is a method for manufacturing another base system having a base system and a carrier element, where in a first process step the module housing is placed on the base element and contacted, and in a second process step the base element together with the module housing is placed and contacted on the carrier element. The placement of the module housing on the base element or of the base element on the carrier element is performable in an advantageous manner using standard processes, and thus is comparatively inexpensive. Also especially advantageously, the use of standard module housings and standard boards is possible, in particular with standard connection surfaces ("foot-prints").

A preferred refinement provides that in the first and/or in the second process step an electrically conductive and/or a mechanically stable connection is made between the module housing and the base element and/or between the base element and the carrier element, preferably by a soldering or bonding process, and especially preferably by a soldering paste screen printing process. Especially advantageously, comparatively inexpensive and/or mechanical placement of components is implementable using standard processes.

DETAILED DESCRIPTION

Figure 1:
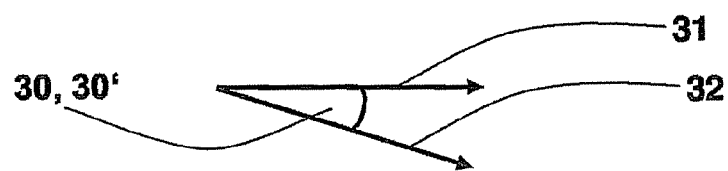
FIG. 1 shows a schematic depiction of misorientations in the related art.

FIG. 1 shows a schematic depiction of misorientations 30' in the related art, where a first direction 31 and a second direction 32 enclose an angle 30. First direction 31 depicts a desired sensing direction of a sensor in a module housing 3, while second direction 32 depicts the installed position of a carrier element 2. According to the related art, carrier element 2 shows module housing 3 in such a way that second direction 32 runs parallel to the sensing direction of the sensor. Angle 30 therefore depicts the misorientation 30' between the sensing device and the desired sensing direction. This misorientation 30' is preferably compensated for in the subsequent figures by base element 1 according to the present invention, in such a way that the sensing device conforms to the desired sensing direction, independently of the installed position of carrier element 2.

Figure 2:
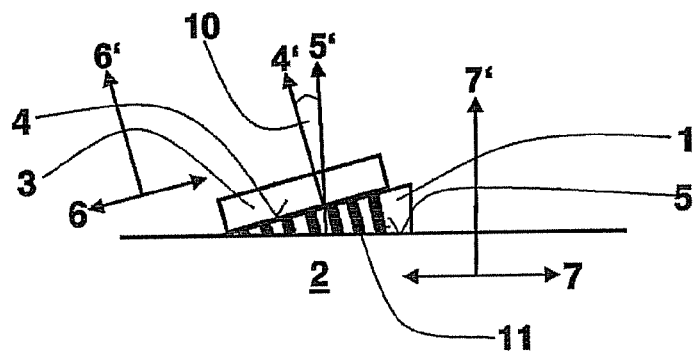
FIG. 2 shows a schematic side view of a base element according to a first specific embodiment of the present invention.

FIG. 2 shows a schematic side view of a base element according to an exemplary first specific embodiment of the present invention, where base element 1 has a first and a second surface 4, 5, a module housing 3 being mounted on first surface 4 and second surface 5 being mounted on a carrier element 2, and an angle 10 between 0 and 90 degrees being provided between a first face normal 4' of first surface 4 and a second face normal 5' of second surface 5. In particular, angle 10 corresponds to misorientation 30' depicted in FIG. 1. Module housing 3 and carrier element 2 have a first and a second main extension plane 6, 7 with third and fourth face normals 6', 7', third face normal 6' running essentially parallel to first face normal 4' and fourth face normal 7' running essentially parallel to second face normal 5'. Carrier element 2 preferably includes a circuit board, and module housing 3 includes a motion sensor. First surface 4 includes a first electrical connection surface for module housing 3 and second surface 5 includes a second electrical connection surface for carrier element 2, the first and second connection surfaces preferably including a standardized connection surface, i.e., a standardized "footprint" of standard bases or standard chip carriers or standard plug connections, and especially preferably the first connection surface being different from the second connection surface. Furthermore, the base element has a plurality of electrically conductive connections 11 between module housing 3 and carrier element 2 or between the first and the second connection surfaces, so that module housing 3 or the sensor of module housing 3 makes electrical contact with carrier element 2 or with the circuit board.

Figures 3A, 3B:
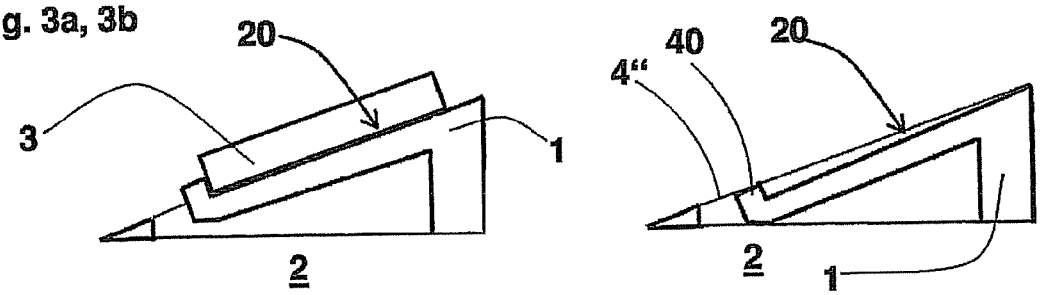
FIGS. 3a and 3b show schematic side views of a base element according to a second specific embodiment of the present invention.

FIGS. 3a and 3b each depict a schematic side view of a base element according to a second specific embodiment of the present invention, the second specific embodiment being essentially the same as the first specific embodiment depicted in FIG. 2, base element 1 having a spring element 20 designed in such a way that a spring motion of first surface 4 essentially parallel to first face normal 4' is made possible, and in addition base element 1 having a pre-fixing edge 40. Pre-fixing edge 40 prevents module housing 3 from sliding off of first surface 4 (in the direction of second surface 5) while module housing 3 is being mounted. In particular, in a mounting process using soldering paste the module housing is prevented from sliding off before the soldering paste hardens. Spring element 20 enables first surface 4 and hence prefixing edge 40 to pivot in the direction of second surface 5, so that first surface 4" is not broken through by pre-fixed edge 40 and it becomes possible to place components on first surface 4 using a screen printing process. In FIG. 3a a module housing 3 is placed on first surface 4 and spring element 20 is depicted in the equilibrium position, whereas in FIG. 3b no components have been placed on first surface 4 and spring element 20 is shown in a deflection position in the direction of second surface 5.

Figure 4:
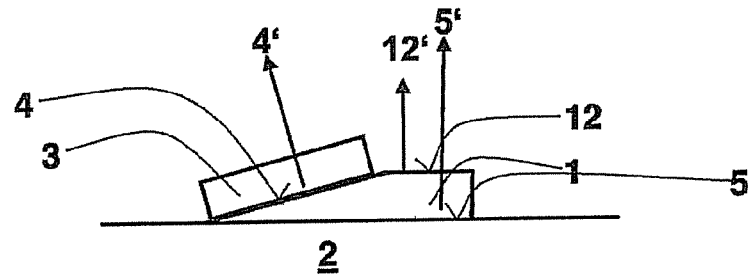
FIG. 4 shows a schematic side view of a base element according to a third specific embodiment of the present invention.

FIG. 4 shows a schematic side view of a base element according to a third specific embodiment of the present invention, the third specific embodiment being essentially identical to the first specific embodiment depicted in FIG. 2, base element 1 having a third surface 12 having a fifth face normal 12', and fifth face normal 12' running essentially parallel to second face normal 5'. Third surface 12 serves in particular as a suction surface for a vacuum gripper of an automatic printed board assembly for mechanically positioning base element 1 or the base system on a carrier element 2.

Figure 5:
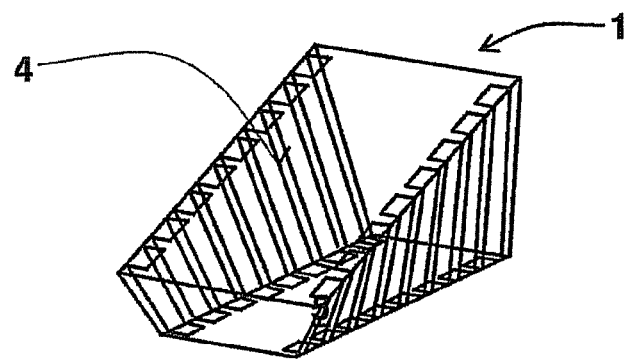
FIG. 5 shows a perspective schematic side view of a base element according to a fourth specific embodiment of the present invention.

FIG. 5 shows a schematic side view of a base element according to a fourth specific embodiment of the present invention, the fourth specific embodiment being essentially identical to the first specific embodiment depicted in FIG. 2, first surface 4 having a first electrical connection surface for module housing 3 and second surface 5 having a second electrical connection surface for carrier element 2, preferably the first and second connection surfaces each including a standardized connection surface ("footprint") and furthermore the first connection surface being different from the second connection surface. Thus base element 1 also functions as an adapter between a first and a second connection surface.

What is claimed is:

1. A base element comprising:
    a first surface adapted to receive a module housing; and
    a second surface adapted to be mounted on a carrier element,
    wherein an angle between 0 and 90 degrees is defined between a first face normal of the first surface and a second face normal of the second surface; and
    wherein the first surface has a first electrical connection surface for the module housing and the second surface has a second electrical connection surface for the carrier element, the first and second connection surfaces including a standardized connection surface, and the first connection surface being not identical to the second connection surface.

2. The base element according to claim 1, wherein the module housing and the carrier element have a first and a second main extension plane having a third and a fourth face normal, the third face normal running substantially parallel to the first face normal and the fourth face normal running substantially parallel to the second face normal.

3. The base element according to claim 1, wherein the carrier element includes at least one of (a) a circuit board, (b) a board, (c) a conductor path and (d) a plurality of conductor paths.

4. The base element according to claim 1, wherein the module housing includes an electrical, electronic and/or microelectronic component, including at least one of a micromechanical rotational speed sensor and acceleration sensor.

5. The base element according to claim 1, further comprising a spring element adapted in such a way that at least one of (a) a spring motion of the first surface parallel to the first and/or second face normals is made possible and (b) the base element has a pre-fixing edge.

6. The base element according to claim 1, further comprising a third surface having a fifth face normal, the fifth face normal running substantially parallel to the second face normal.

7. The base element according to claim 1, wherein the base element has at least one electrically conductive connection between the module housing and the carrier element and between the first and second connection surfaces.

8. A base system comprising:
    a module housing; and
    a base element including:
    a first surface adapted to receive the module housing, and
    a second surface adapted to be mounted on a carrier element,
    wherein an angle between 0 and 90 degrees is defined between a first face normal of the first surface and a second face normal of the second surface,
    wherein the module housing is at least one of (a) materially, (b) frictionally and (c) positively fixed mechanically on the first surface, and
    wherein the first surface has a first electrical connection surface for the module housing and the second surface has a second electrical connection surface for the carrier element, the first and second connection surfaces including a standardized connection surface, and the first connection surface being not identical to the second connection surface.

* * * * *